(12) United States Patent
Shum et al.

(10) Patent No.: US 6,980,435 B2
(45) Date of Patent: Dec. 27, 2005

(54) MODULAR ELECTRONIC ENCLOSURE WITH COOLING DESIGN

(75) Inventors: Kent N. Shum, Fremont, CA (US); Randall J. Diaz, Gilroy, CA (US); Robert J. Tong, Tracy, CA (US); Perry L. Hayden, Salinas, CA (US); Ming Leong, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 10 days.

(21) Appl. No.: 10/767,936

(22) Filed: Jan. 28, 2004

(65) Prior Publication Data

US 2005/0162831 A1  Jul. 28, 2005

(51) Int. Cl.[7] ............................................. H05K 7/20
(52) U.S. Cl. ................. 361/695; 361/690; 361/691; 361/694; 174/16.1; 165/80.3; 454/184
(58) Field of Search ................. 361/687–691, 361/694–695, 715–716, 724–727, 796–797; 174/16.1, 66, 252; 165/104.33, 122; 454/184

(56) References Cited

U.S. PATENT DOCUMENTS

| | | | | |
|---|---|---|---|---|
| 6,025,989 A | * | 2/2000 | Ayd et al. | 361/695 |
| 6,031,717 A | * | 2/2000 | Baddour et al. | 361/687 |
| 6,115,250 A | * | 9/2000 | Schmitt | 361/695 |
| 6,574,100 B1 | * | 6/2003 | Anderson | 361/687 |
| 6,700,778 B1 | * | 3/2004 | Wang | 361/690 |

* cited by examiner

Primary Examiner—Boris Chervinsky

(57) ABSTRACT

An embodiment of a modular electronic enclosure is provided as including a chassis having a first portion defining a first compartment, and a second portion defining a second compartment. First and second replaceable units are replaceably received within the first and second compartments, respectively. The modular electronic enclosure also has a fan unit that is replaceably received within a compartment defined by the first portion or the second portion. The fan unit is configured to pull in cooling air through the first portion and exhaust pressurized cooling air through the second portion. A method of cooling a modular electronic enclosure defining first and second compartments is also provided.

26 Claims, 10 Drawing Sheets

MODULAR ELECTRONIC ENCLOSURE WITH COOLING DESIGN

BACKGROUND

Earlier of electronic enclosures, such as those used in servers, were stacked one on top of the other in standard Electronic Industry Association (EIA) racks. These earlier enclosures carried various electronic components, such as a power supply, a logic board or "motherboard," input/output ports, and a fan unit, but these components were in cumbersome arrangements. For instance, to service the interior components, either a snap-on front plate or a conventionally hinged front door first had to be opened, or the entire enclosure taken from the rack and a top cover removed. Often the fan had to be removed before electronic components could even be accessed. This accessing operation was particularly difficult for servicing personnel, since if the unit was deactivated, replacement had to be accomplished within a short time span (e.g., ten minutes) so other components would not lose stored information. Also, the number and size of components housed within these earlier enclosures was often limited by the cooling capability of the enclosure. In some earlier front access enclosures, the ability to control fan airflow when changing components was limited by their air dam designs, which function to limit fan air in-take when a component is removed. These earlier air dams were either a hinged saloon door style, or a horizontally hinged door relying on gravity for closure, both of which inherently leak-in large quantities of air.

SUMMARY

An embodiment of a modular electronic enclosure is provided as including a chassis having a first portion defining a first compartment, and a second portion defining a second compartment. First and second replaceable units are replaceably received within the first and second compartments, respectively. The modular electronic enclosure also has a fan unit that is replaceably received within a compartment defined by the first portion or the second portion. The fan unit is configured to pull in cooling air through the first portion and exhaust pressurized cooling air through the second portion.

BRIEF DESCRIPTION OF THE DRAWINGS

The present invention can be further understood by reference to the following description and attached drawings that illustrate the embodiment(s). Other features and advantages will be apparent from the following detailed description of the embodiment(s), taken in conjunction with the accompanying drawings, which illustrate, by way of example, the principles of the invention.

FIG. 2A–2E show the bezel latching mechanism of FIG. 1, with:

FIG. 2A being an enlarged, exploded view,

FIG. 2B being an enlarged perspective view shown before attaching the bezel,

FIG. 2C being an enlarged detailed perspective view during attachment,

FIG. 2D being an enlarged detailed perspective view shown after attachment, and

FIG. 2E being an enlarged cross sectional view taken along lines 2E—2E of FIG. 2A;

DETAILED DESCRIPTION OF THE EMBODIMENTS

In the following description of the invention, reference is made to the accompanying drawings, which form a part hereof, and in which is shown by way of illustration a specific example in which the invention may be practiced. It is to be understood that other embodiments may be utilized and structural changes may be made without departing from the scope of the present invention.

Figure 1:
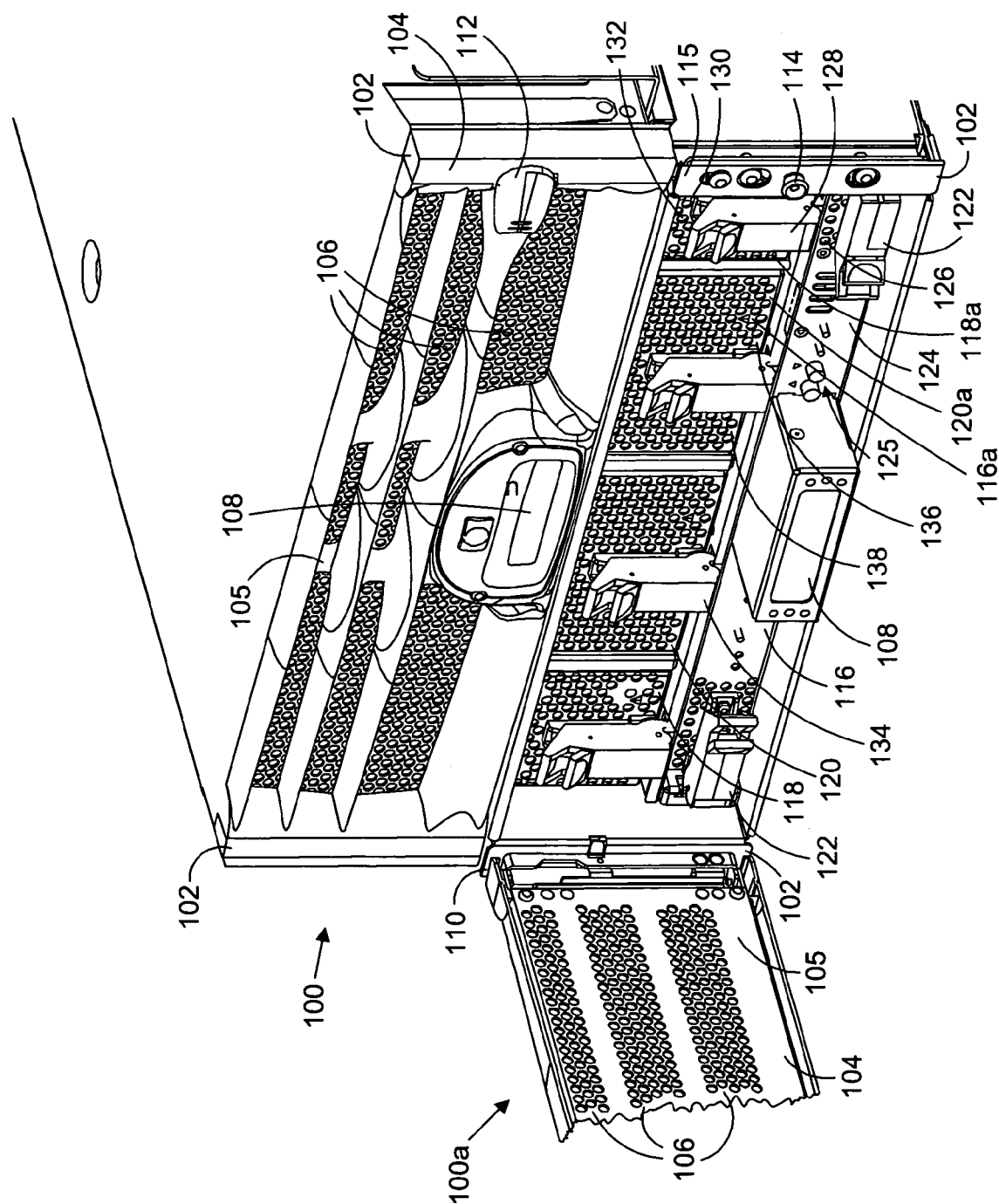
FIG. 1 is a partially fragmented, front elevational view showing one embodiment of a modular electronic enclosure of the present invention mounted in an EIA rack for use, actually showing two enclosures, one with a front faceplate bezel closed, and the other with the bezel open.

I. General Overview:

FIG. 1 shows one embodiment of a modular electronic enclosure 100 mounted to a standard EIA rack for convenience, although other mounting systems may be employed. The enclosure 100 includes a front faceplate or bezel 104, which is shown in a closed position. Also shown in FIG. 1 is a modular electronic enclosure 100a, identical to enclosure 100 except that the bezel 104 is shown in an open position. Note the use herein of the an alpha designator (a) indicates different placement or position of a like-numbered component without the prime designator, unless otherwise noted. Bezel 104 includes a frame 105 and a series of air inlet apertures or inlet ports 106. The bezel 104 may also include provisions for viewing a display 108, which may provide identifying, status, or other information regarding components within the enclosure 100.

The bezel 104 may be opened with a bezel latching mechanism 110, described in further detail below, when a latch, such as spring-loaded latch 112 is activated. When closed, the latch 112 engages a latch post 114 projecting from a chassis 115 of enclosure 100. Housed within chassis 115 are a variety of electrical components, in this embodiment, customer replaceable units (CRU's), such as a logic board or motherboard 116, a pair of power units 118, 118a, and a pair of fan units 120, 120a. The motherboard 116 may be removably secured within chassis 115 by a pair of latches 122 supported by a frame 124 of motherboard 116. The frame 124 may also support various input devices for the motherboard 116, such as a pair of scrolling (up/down) buttons 125 which may be used to show and/or select different information on display 108. The frame 124 defines a series of air inlet apertures or ports 126, here shown arranged around the latches 122, although other locations in the front portion of frame 124 may be more suitable in other implementations.

In a similar fashion, each of the power units 118, 118a may be held in place by a latch 128 supported by a frame 130 of each power unit. Each power unit frame 130 defines a series of air inlet apertures or ports 132. Each fan unit 120, 120a may be held in place by a latch 134 supported by a frame 136 of each fan unit. Each fan unit frame 136 defines a series of air inlet apertures or ports 138. Location of the inlet ports 132, 138 are shown by way of example only, and may be placed in other arrangements in other implementations.

This completes the overview discussion of the front loading CRU's housed within the modular electronic enclosure 100. Before moving on to other portions of the enclosure 100, one embodiment of a bezel latch mechanism 110 will be discussed.

II. Bezel Latch Mechanism:

FIGS. 2A–2E show one embodiment of a bezel latch mechanism 110 used in enclosure 100 to attach the bezel 104 to the enclosure chassis 115. First turning to FIG. 2A, the components will be discussed from right to left, that is starting from chassis 115 and moving outward toward the bezel 104. The chassis 115 supports a latch lock engaging member, here shown as chassis defining a latch lock hole 200. The chassis also supports two hinge posts 202 and 204 which project outwardly from the chassis. The latch mechanism 110 also has a chassis hinge mount 210 which defines two hinge posts slots 212 and 214 located to receive the hinge posts 202 and 204, respectively. The chassis hinge mount 210 has a side wall 215, as better seen in FIG. 2B. The mount 210 also defines a cut-down neck portion 216 and an alignment pin 218.

The latch mechanism 110 includes an activation member, here illustrated as a leaf spring latch 220. The spring latch 220 includes a latch finger 222 which defines an elongated alignment slot 223 that receives alignment pin 218. The slot 223 is elongated along the longitudinal axis of finger 222 to allow the pin 218 to slide within slot 223, as well as move partially out of slot 223, during operation which allows the spring latch 220 to move relative to the chassis hinge mount 210. The latch finger 222 also has a blunt end 224 and an upper ramped edge 225 leading down to the blunt end. Perhaps as better shown in FIG. 2B, the spring latch 220 is attached to the interior of side wall 215 of the chassis hinge mount 210 by a pair of rivets 226 and 228, shown with their heads projecting from the latch spring in FIG. 2A.

Figure 2E:
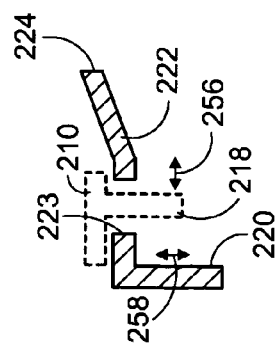
Figure 2A:
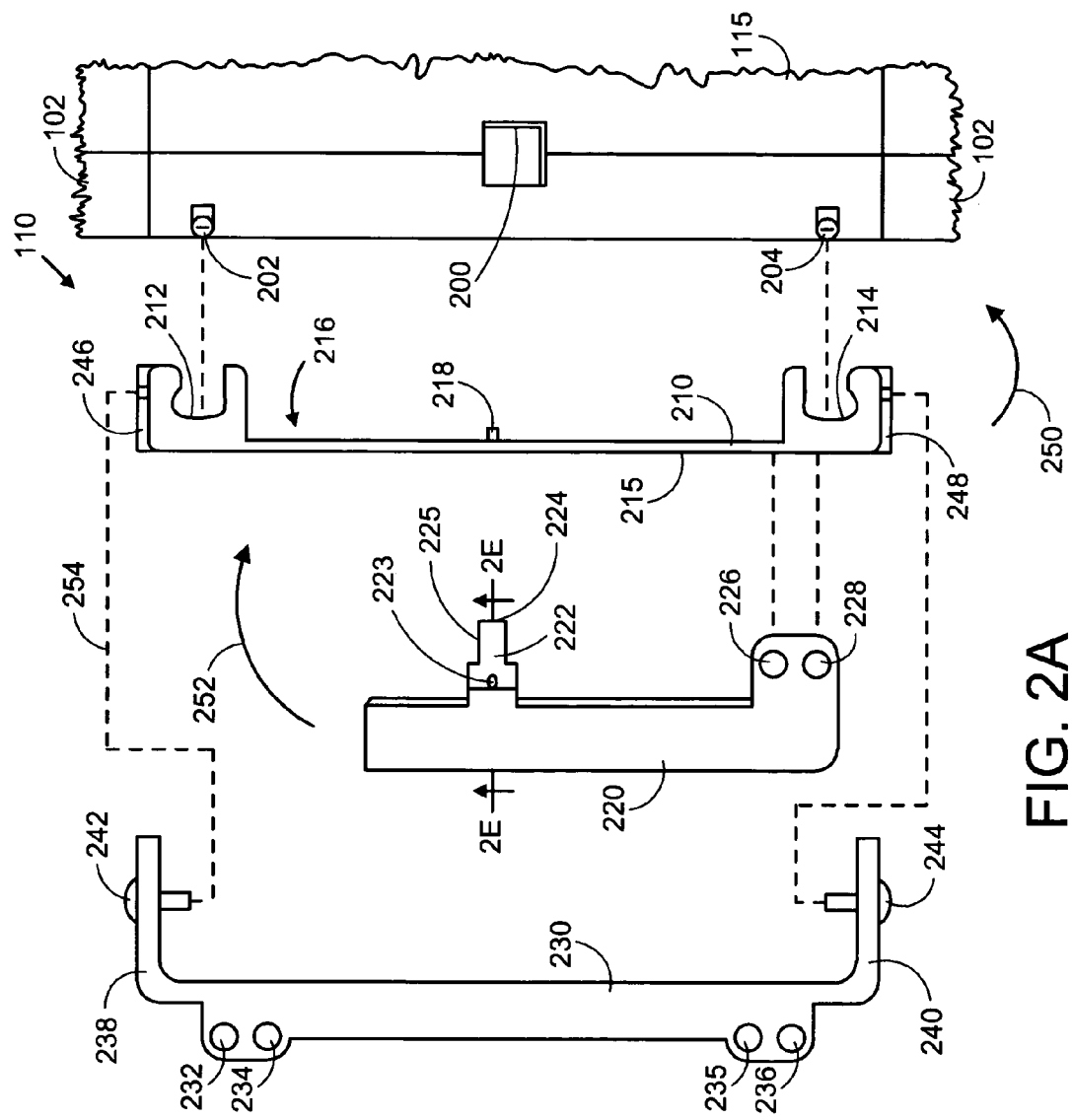
Figure 2D:
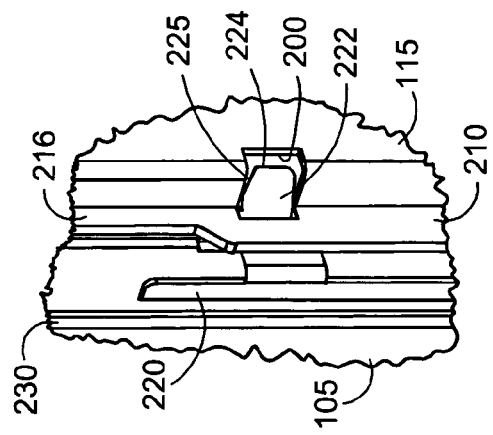
Figure 2C:
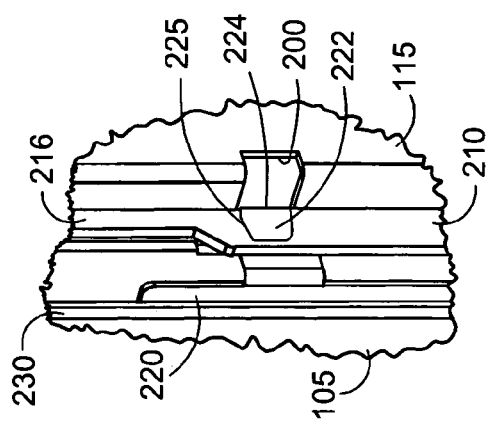
Figure 2B:
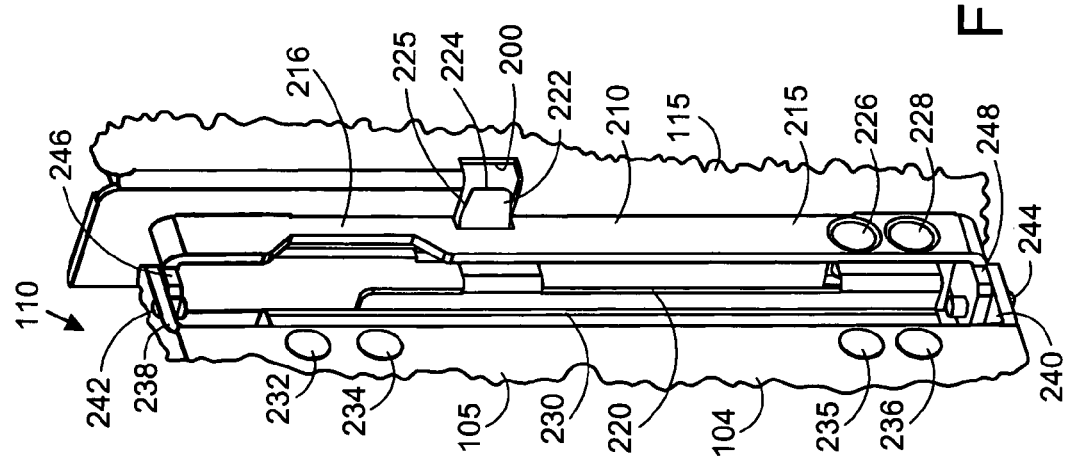

Progressing on to the next component to the left, we see a bezel hinge mount 230 which attaches by rivets 232, 234, 236 and 238 to an interior wall of the bezel frame 105, as shown in FIG. 2B. Mount 230 also includes a pair of hinge plates 238 and 240 which each define holes to receive hinge pins 242 and 244, respectively. The chassis hinge mount 210 also has a pair of hinge pin flanges 246 and 248, which each define holes therethrough to receive hinge pins 242 and 244, respectively, as indicated by the dashed lines in FIG. 2A, and as best seen in FIG. 2B. The terms "hinge plate" and "hinge pin flange" may be considered as interchangeable terms, with the only differentiation herein being for the sake of clarifying the explanation as to which component is being referred to in a particular discussion.

FIG. 2A has several dashed lines and curved arrows which may need some explanation to give one the proper orientation of the components of the bezel latch mechanism 110. To show the orientation of the chassis hinge mount posts slots 212, 214 with respect to hinge posts 202 and 204, respectively, curved arrow 250 indicates that mount 210 needs to be rotated 90 degrees. Similarly, curved arrow 252 indicates that given the position of mount 210 in FIG. 2A, the spring latch 220 needs to be rotated 90 degrees so rivets 226, 228 may be inserted through side wall 215 of mount 210 before being received by the spring latch 220. The dashed lines in FIG. 2A indicate the various components that match together, such as dashed line 254 which indicates hinge pin 242 is to be received by the hole defined by hinge pin flange 246.

In the past, the front opening electronic enclosures used faceplates which were either, (1) hinged, or (2) of the snap-on variety. The hinged faceplates often took up necessary space in the service aisle during maintenance, where they could easily be bumped or damaged by service personnel. These hinged faceplates typically used a conventional house door type hinge, a gate hinge, a continuous hinge, or other permanently attached hinge, which prevented the faceplate from being removed if it was obstructing work or workers. The snap-on faceplates required complete removal before any of the internal components could be accessed even for a quick adjustment or check-up, such as to use the scrolling buttons 125 on motherboard 116.

The bezel latch mechanism 110, not only provides for a rapid hinged opening, but also for complete removal of the bezel 104 if desired. During normal operation, hinge posts 202, 204 reside within an upper portion of slots 212, 214, respectively (see FIG. 2A). After opening the spring-loaded latch 112 (FIG. 1), the bezel 104 may be swung open to the position of FIG. 2B where the latch finger 222 has disengaged lock hole 200, allowing service personnel to lift the bezel off of posts 202 and 204 (FIG. 2A) for removal from chassis 115. Thus, through the use of bezel latch mechanism 110, the bezel 104 may function as a hinged faceplate as well as a snap-off faceplate, depending upon the need at hand. Before moving on to a detailed explanation of the operation of the bezel latch mechanism 110, a further explanation of the spring latch 220 with respect to FIG. 2E may be helpful.

For further clarification, FIG. 2E shows one embodiment of the cross sectional shape of latch finger 222, with respect to the engagement of pin 218 and alignment hole 223. The blunt end 224 of the latch finger 222 extends outwardly at an angle from the portion of finger 222 where slot 223 resides, allowing the latch finger to better engage the lock hole 200 in the illustrated embodiment. The elongated nature of alignment slot 223 allows the alignment pin 218 to move longitudinally within slot 223, as indicated by arrow 256. Furthermore, the length of pin 218 allows it to move inwardly and outwardly from slot 223, as indicated by arrow 258 to facilitate flexing of the latch spring 220 during operation.

Referring briefly to FIG. 2A, to replace the bezel 104 after servicing, the post slots 212, 214 first receive- hinge posts 202, 204 through their lower open mouths, and then as bezel 104 moves downwardly, perhaps under the force of gravity or under manual pressure, the posts come to rest within the upper portion of the slots, leaving the bezel pivotally attached to the chassis for hinged opening and closing. This reattachment operation is shown in FIGS. 2B–2D, with unattachment occurring the opposite order. In a beginning attachment phase shown in FIG. 2B, the posts 202, 204 are entering the mouths of slots 212, 214 (see FIG. 2A), respectively, and the latch finger 222 has not yet began to engage lock hole 200. In a transitional phase shown in FIG. 2C, posts 202, 204 are beginning to move upwardly along the vertical portion of slots 212, 214 (FIG. 2A), while the ramped edge 225 of latch finger 222 is beginning to gently engage lock hole 200.

A final, fully engaged state is shown in FIG. 2D, where posts 202, 204 have come to rest in the top portion of slots 212, 214 (see FIG. 2A), and the latch finger 222 is fully engaged within lock hole 200. As the final stage of FIG. 2D arrives, the spring action of latch 220 is felt by a person replacing bezel 104 when finger 222 fully engages lock hole 200, giving this person a positive tactile indication that hinge posts 202, 204 (FIG. 2A) are in the proper position for swinging bezel 104 shut. Thus, the latch mechanism 110 provides a tactile response for service personnel when the bezel 104 has been snapped back into place for a hinged closing. Similarly upon opening, the disengagement of the latch finger 222 from lock hole 200 is also felt, giving the person a tactile response that bezel 104 is ready to be removed from posts 202 and 204 (see FIG. 2A).

Figure 3:
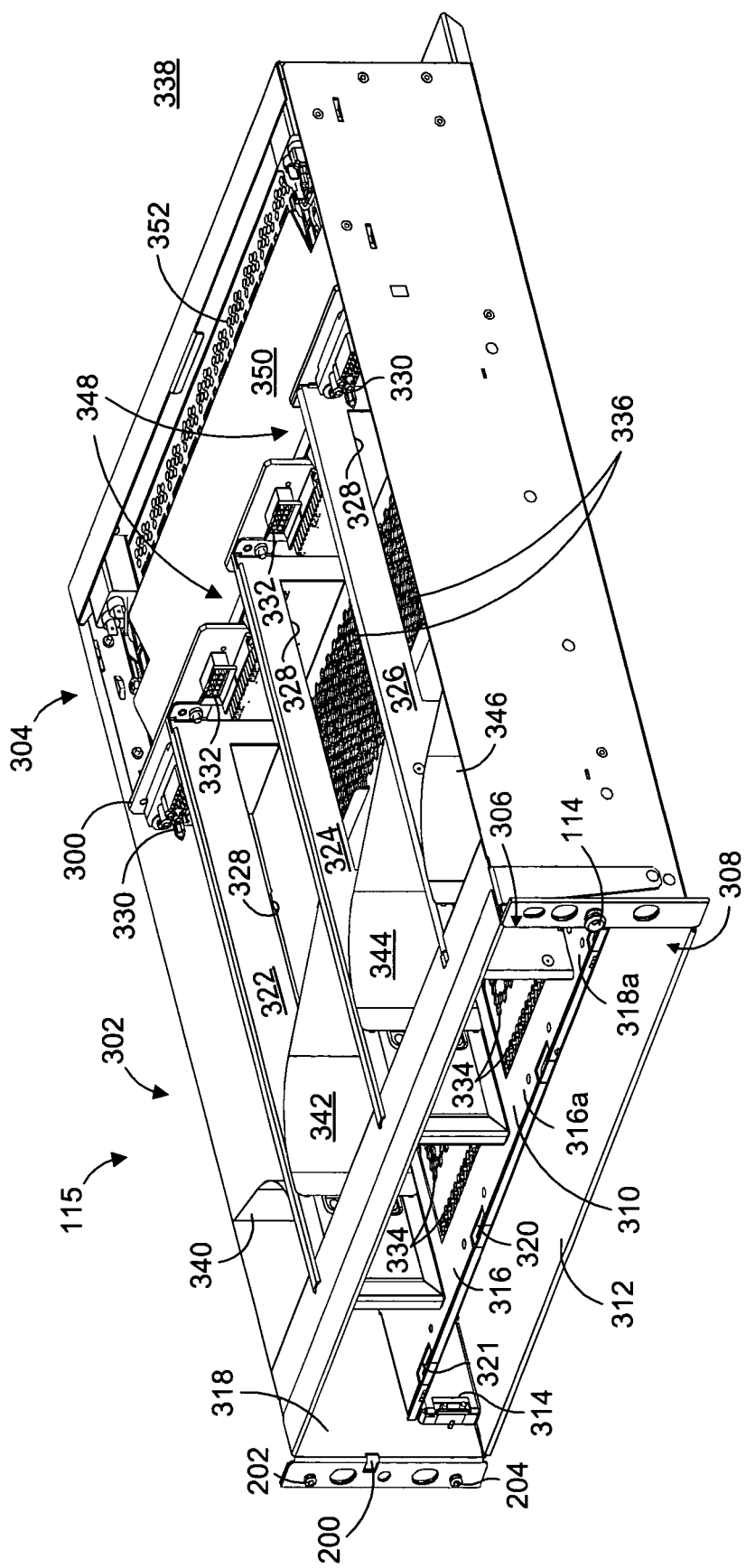
FIG. 3 is a perspective view of a chassis of the enclosure of FIG. 1, with various replaceable units (CRU's) of electronics removed.

III. Enclosure Chassis With Air Dams:

FIG. 3 shows the chassis 115 of the illustrated embodiment of modular electronic enclosure 100 as including a midplane 300, which divides the chassis into a front portion 302 and a rear portion 304. The front portion 302 will be discussed first, followed by a discussion of airflow vents through chassis 115. In this embodiment, the front portion 302 is divided into an upper portion 306 and a lower portion 308 by deck 310. The lower portion 308 comprises a single compartment 312 which includes a pair of motherboard latch receptacles, one on the right side and the other on the left side, such as left latch receptacle 314 visible in the view of FIG. 3.

The upper portion 306 is divided into four compartments, here shown as adjacent fan compartments 316 and 316a, and flanking power compartments 318 and 318a. The fan compartments 316, 316a each included a fan latch receptacle, such as receptacle 320 for left fan compartment 316, while the power compartments 318, 318a each include a power latch receptacle, such as receptacle 321 for the left power compartment 318. Thus, the lower compartment latch receptacles 314 receive latches 122, while the fan compartment latch receptacles 320 receive latches 134, and the power compartment receptacles 321 receive latches 128 to removably secure the motherboard 116, the fan units 120, 120a, and the power units 118, 118a in place.

The compartments 318, 320, 320a and 318a are each separated by dividers 322, 324 and 326, respectively. Each of the dividers 322–326 defines a window 328 therethrough to allow air to flow between adjacent compartments. At the rear of the power compartments 318 and 318a are electrical connectors 330 which engage mating electrical connectors (not shown) at the rear of each of the power units 118 and 118a, respectively. Similarly, at the rear of fan compartments 316, 316a are electrical connectors 332 which engage mating electrical connectors (not shown) at the rear of each of the fan units 116 and 116a.

Before going into detailed description of airflow through the modular electronic enclosure 100, the various components which contribute to the airflow design are described with respect to the components with which they are associated. The big deck 310 defines therethrough a series of vent holes 334 located toward front portion of each of the fan compartments 316, 316a, and another series of fan vent holes 336 located toward the rear portion of the fan compartments. It is apparent that while groups of circular or rectangular fan vent holes are illustrated herein, the vents may also be arranged as one or more vents slots, or in other geometric patterns or configurations depending upon the particular implementation employed. Similarly, while the compartments 312, 318, 316, 316a and 318a are shown as arranged into upper and lower portion 306, 308 other compartment divisions may be made within chassis 115, depending upon the desired implementation, while still employing the concepts described herein.

The chassis 115 includes four air dams 340, 342, 344 and 346, located near the entrances to compartments 318, 316, 316a and 318a, respectively. Each of the illustrated air dams 340–346 are of a flexible metal spring material which acts as a flap, although in some embodiments a flexible plastic or other similar material may be more suitable. When the upper portion modules 318, 316, 316a and 318a are pulled out of the chassis 115, the air dams 340–346 spring into their closed positions, as shown in FIG. 3I, to prevent an airflow "short-circuit." The simple one-piece design of air dams 340–346 used in this thermal design is believed to be unique, and may be used in other applications, to prevent unwanted airflow through a passageway, such as in a vending machine beverage can-catcher, or other air barriers for refrigeration, heating or ventilation protection when an item needs to occasionally pass through the passageway.

As mentioned the Background section above, earlier air dams were typically of the double hinged saloon-door style, or a horizontally hinged, vertically hung door which was gravity operated, similar to many inside/outside doggie doors, but these earlier designs only prevented 85% of airflow therethrough. In the illustrated embodiment, the air dams 340–346 have shown in testing to be 95% efficient in preventing airflow therethrough when the fan and power units 118, 116, 116a and 118a are removed from compartments, 316, 318, 316a and 318a. While the illustrated air dam 340 swings open toward the right, and air dams 342–346 swing open toward the left, which is convenient for the illustrated embodiment, although it is apparent that left swinging or right swinging air dams may be substituted therefor.

The midplane 300 of chassis 115 also defines a pair of airflow channels 348, located at the rear of each of the fan compartments 316, 316a to allow airflow between the chassis front portion 302 and the chassis rear portion 304. Near the front of the rear portion 304, chassis 115 includes an air metering plate 350, which is ramped upward from the bases of airflow channels 348 toward the rear of chassis 115. As described in further detail below, the metering plate 350 may be replaced with metering plates of different sizes, orientations, and configurations to control airflow between the front and rear portions 302, 304 to accommodate for various cooling capacities required by the components housed therein. Thus, the modular electronic enclosure 100 may be upgraded for larger heat loads by varying the size and configuration of metering plate 350. The rear portion 304 of chassis 115 may define a series of vent holes 352 therein, to vent components housed within the chassis rear portion 304 (see FIG. 7), or alternatively, vent holes 352 may be defined by an upper portion of components housed within the rear portion 304 of chassis 115. The overall airflow design of the modular electronic enclosure 100 will be discussed in more detail after describing the various hot-swappable modular components 116, 118, 120, 120a, 118a housed therein.

Figure 4:
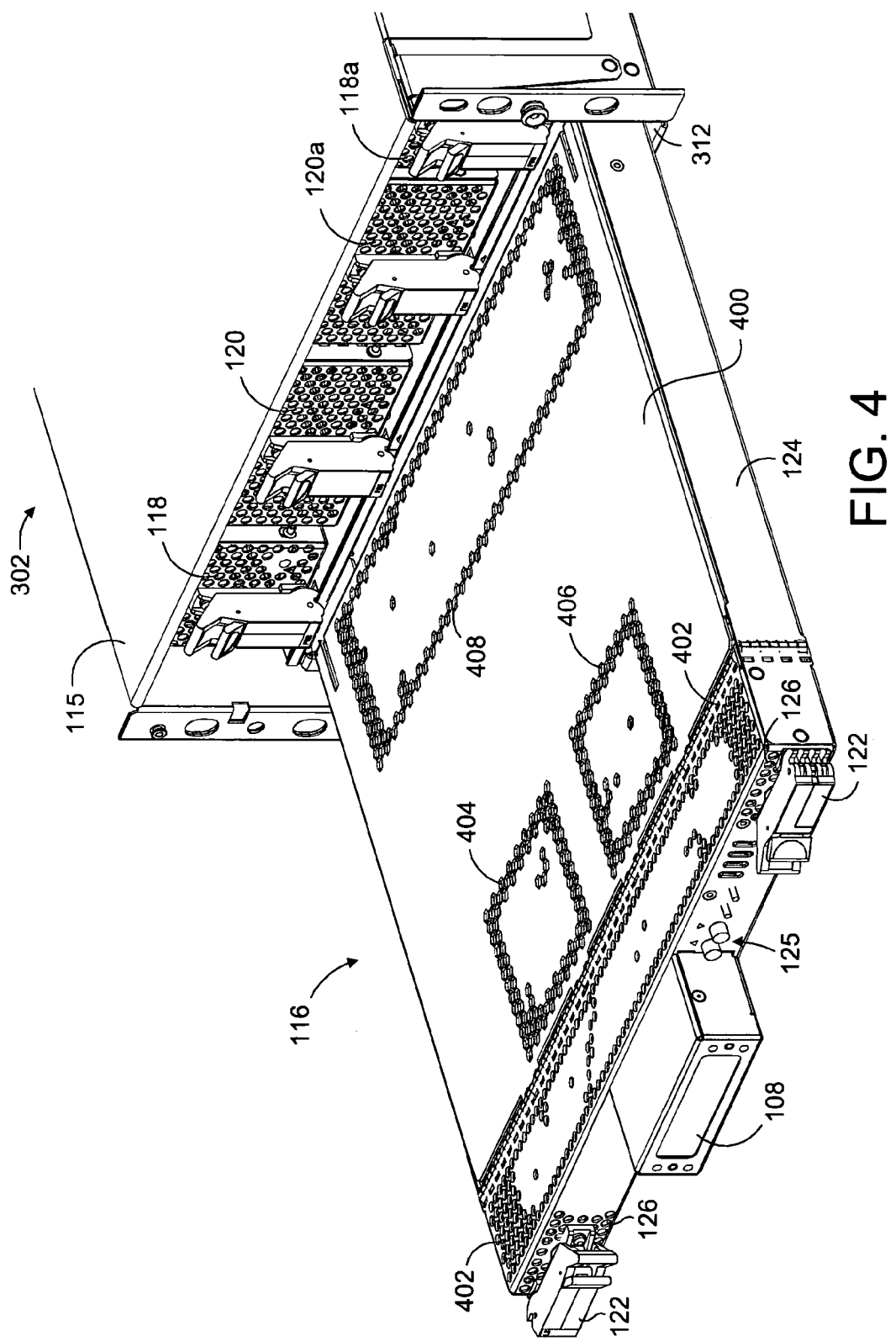
FIG. 4 is a perspective view of a logic board or "motherboard" of the enclosure FIG. 1, shown partially removed from the chassis.

IV. Hot-Swappable Modular Components:

FIG. 4 shows the motherboard 116 removed from chassis 115. The motherboard 116 includes an upper surface 400 of frame 124 which defines series of vent holes 402 therethrough toward the front thereof, and a series of vent holes 404, 406 which reside under vent holes 344 beneath the fan compartments 316, 316a (FIG. 3), respectively. The motherboard frame upper surface 400 also defines a series of vent holes 408 therethrough toward the rear of the motherboard 116, which allow airflow from the motherboard through vent holes 336 of the fan compartments.

Figure 5:
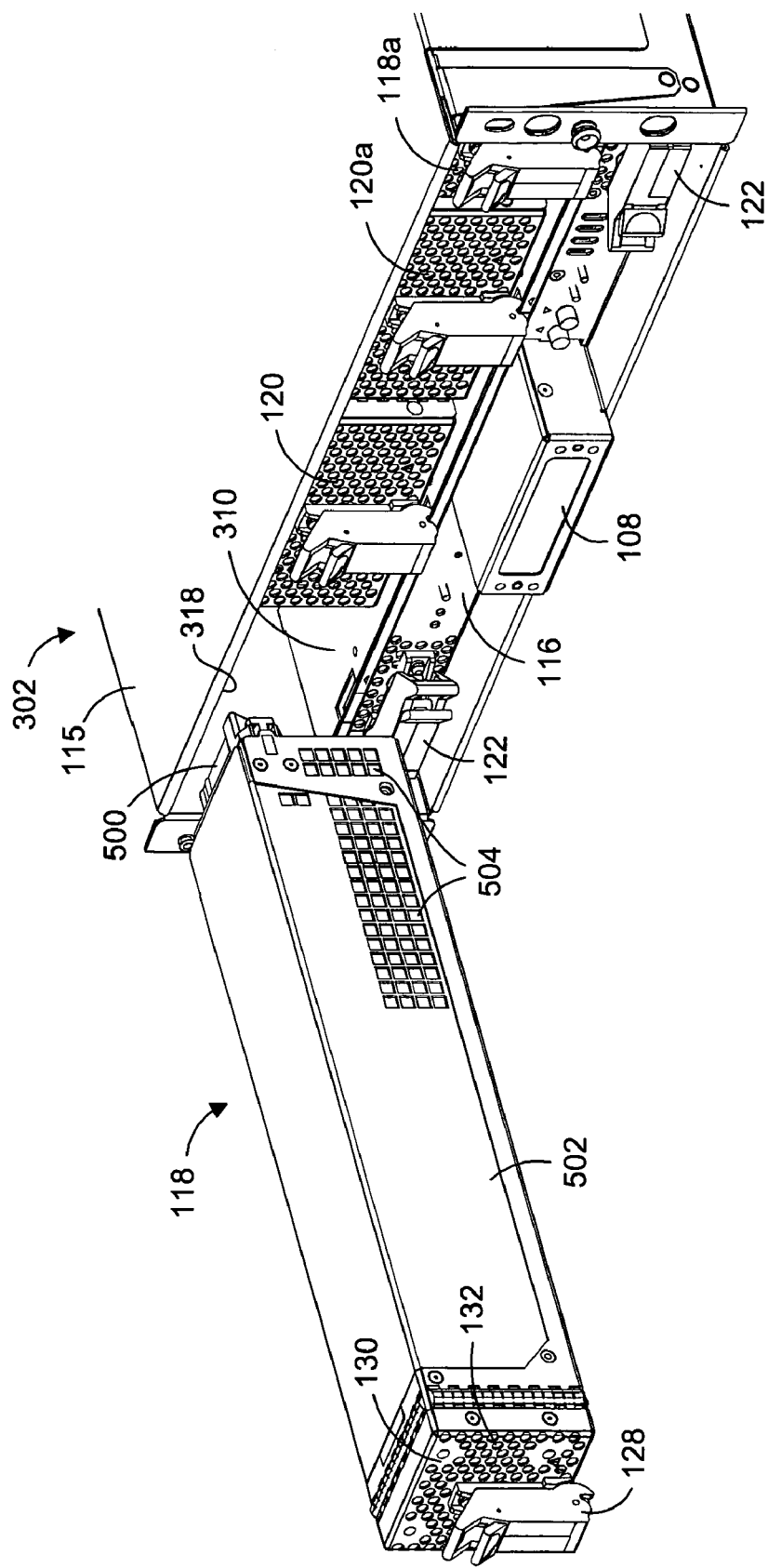
FIG. 5 is a perspective view of a power unit of the enclosure FIG. 1, shown partially removed from the chassis.

FIG. 5 shows power module 118 as having an electrical connector 500 which mates with connector 330 when the power module 118 is inserted into the power unit compartment 318. The power unit 118a is constructed a similar fashion. Each power unit frame 130 has an interior sidewall 502 which defines a series of vent holes 504 therethrough to facilitate airflow from the power units 118, 118a toward the fan modules 120, 120a, respectively.

Figure 6:
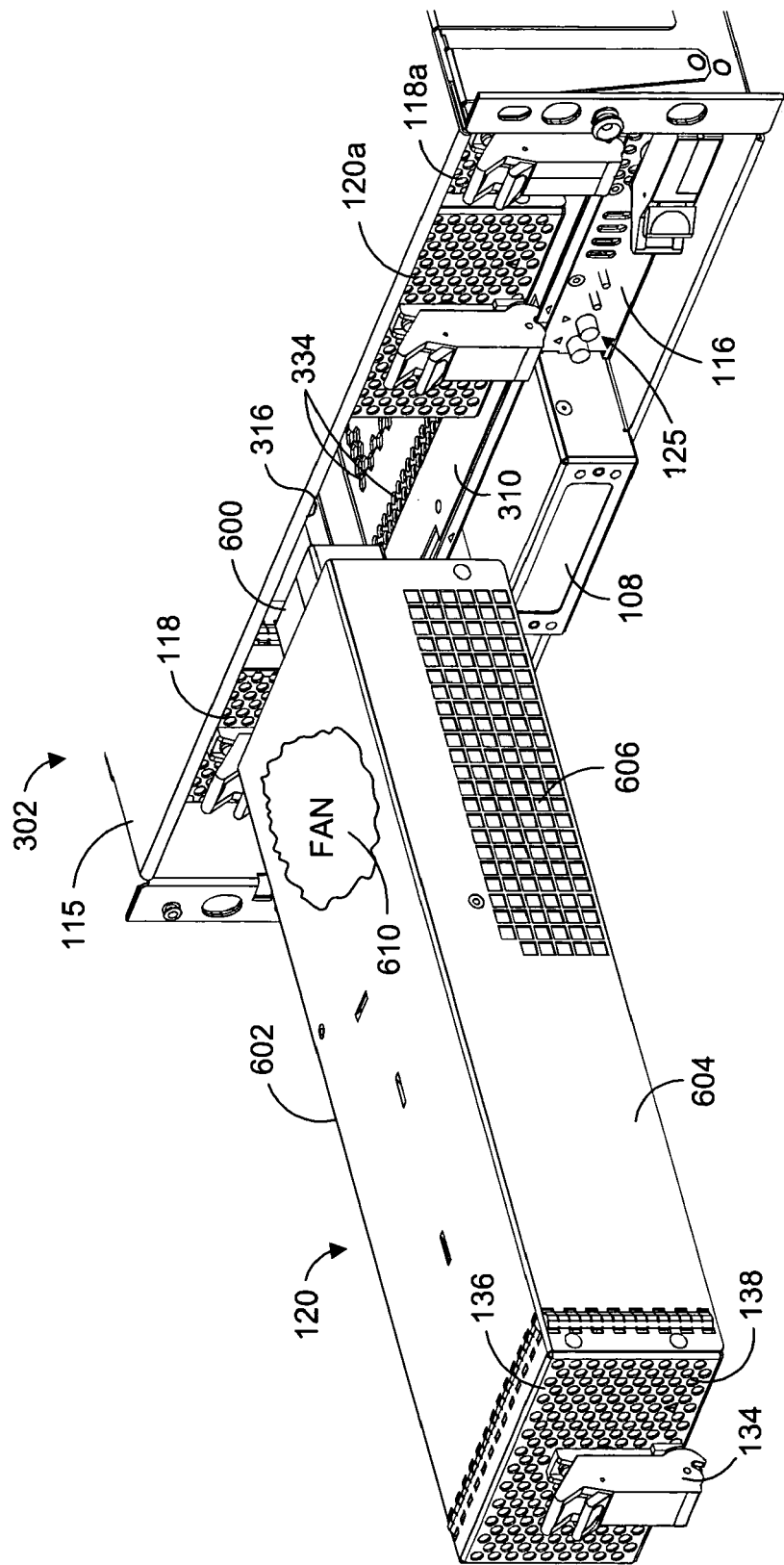
FIG. 6 is a perspective view of a fan unit of the enclosure FIG. 1, shown partially removed from the chassis.

FIG. 6 shows one fan unit 120 as including an electrical connector 600 located toward the rear of the unit to engage electrical connector 332 when the fan unit is inserted into the fan compartment 316. The fan unit 120a is constructed in a similar fashion. The frames 136 of the fan units 120, 120a each have opposing side surfaces 602 and 604, which each may define a series of vent holes 606 therethrough for airflow through windows 328 of dividers 322–326. Each of the fan units 120 and 120a may include a ventilation member, such as fan 610, the operation of which will be described in further detail below under the Airflow section.

Figure 7:
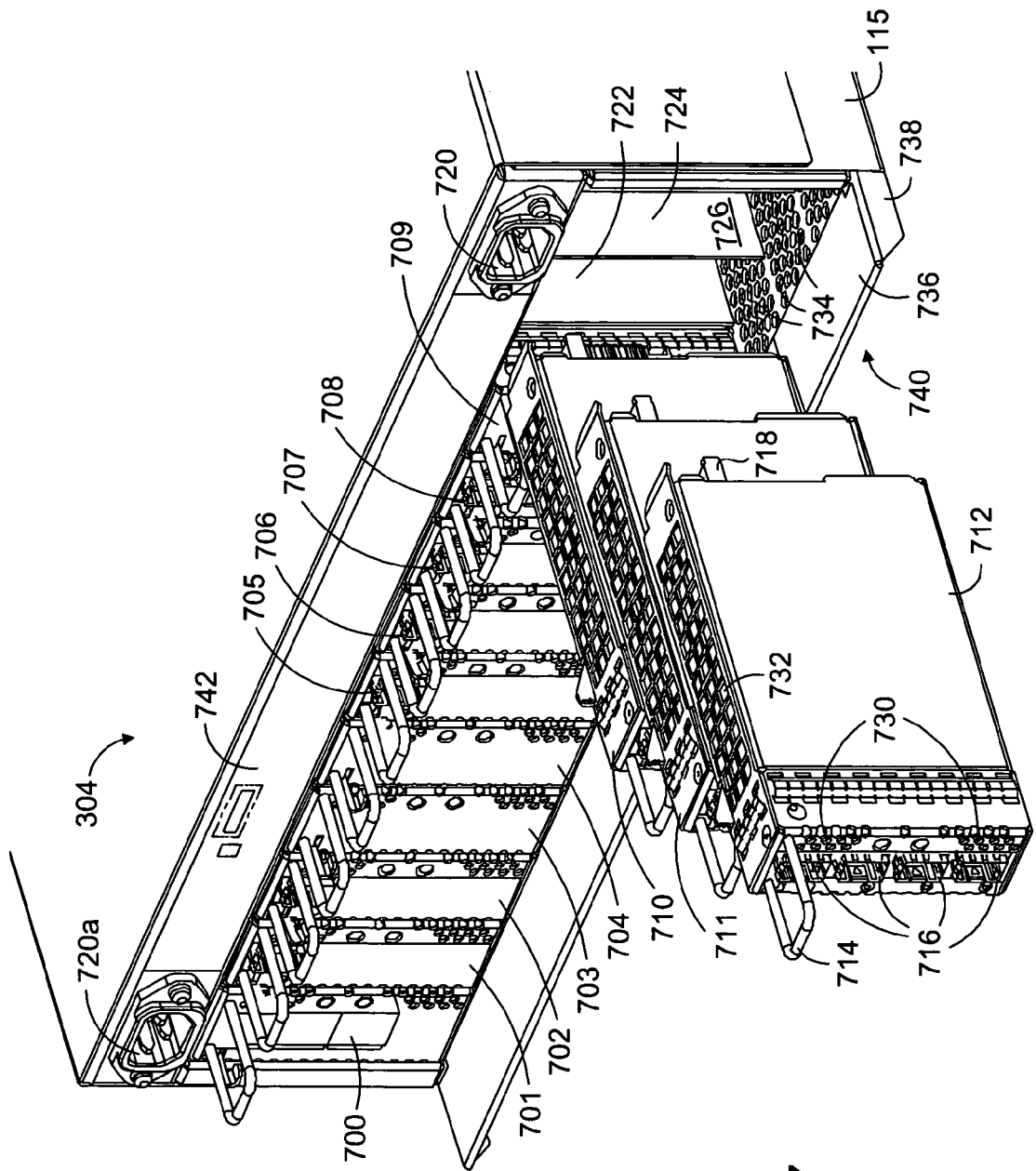
FIG. 7 is a perspective view of an input/output unit of the enclosure FIG. 1, shown partially removed from the chassis.

Thus far, the CRU's residing within the front portion 302 of chassis 115 had been discussed. FIG. 7 shows thirteen CRU's 700–712 residing within the chassis rear portion 304, although it is apparent that in other implementations other modules may reside therein and be of different numbers and different configurations. Each CRU 700–712 has a handle 714 for inserting and extracting the unit from chassis 115. Most of the CRU's are input/output units, each having four pairs of input/output receptacles 716 (shown only on CRU module 712), such as those for receiving fiber-optic cables. In one embodiment, CRU's 703 and 704 are router interconnects, and CRU 700 is a maintenance port. Each of the CRU's 700–712 may include an electrical interconnect 718, which mates with an electrical interconnect (not shown) the located underneath the air metering plate 350 along the rear surface of midplane 300.

The chassis 115 also supports a pair of electrical power interconnects 720 and 720a, here shown located above CRU's 700 and 712. The interior of the chassis rear portion 304 is divided into the thirteen compartments, such as compartments 722 and 724 which are separated by divider 726 to receive CRU's 711 and 712, respectively. Each of the CRU's 700–712 has an exposed face which defines a series of vent holes 730 therethrough, and an upper surface which defines another group of vent holes 732 therethrough. The lower surface of each of the CRU's 700–712 may also define vent holes for airflow between the CRU's and chassis vent holes 734 defined by a floor 736 underneath each of the CRU compartments, such as compartments 722 and 724. The floor 736 is preferably elevated by footing walls, such as wall 738, to define an airflow passageway 740 underneath floor 736. The chassis 115 also has a rear wall 742 located above CRU's 700–712, which besides being a convenient location for mounting interconnects 720, 720a, and displaying various manufacturing and certification indicia, also serves as an air deflection wall, as described in greater detail below with respect to FIG. 9.

The chassis 115 illustrates only one embodiment of a modular electronic enclosure, and the various components housed within upper and lower portions 306, 308 of front portion 302 as well as the components housed within the rear portion 304 are merely shown by way of example, and other arrangements for the compartments, and placement of the midplane 300, if used, may be employed. These modular components, as mentioned above, are known as customer replaceable units or CRU's, and may be replaced without disengaging power from modular electronic enclosure 100. Even the dual fan units 120, 120a may be replaced without de-energizing the electronic enclosure 100, while one fan unit is replaced, the other continues to provide cooling. The same holds true for the dual power units 118, 118a, one of which may be replaced while the other continues to power the CRU's remaining within enclosure 100. Additionally, through the use of the compartment dividers 310, 322–326 and 726, the CRU's require no effort in alignment prior to inserting each module, such change-outs are speedily accomplished.

Figure 8:
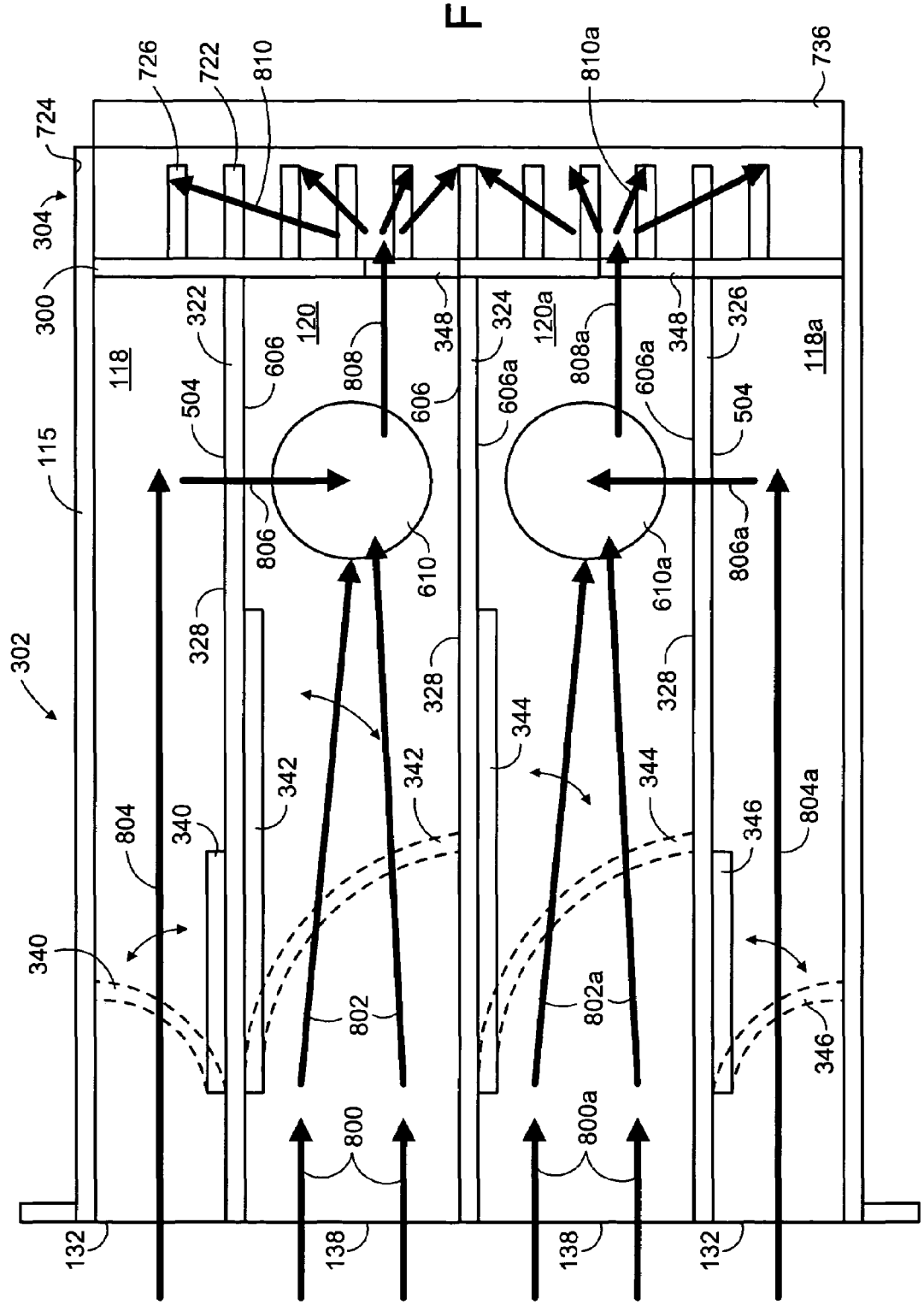
FIG. 8 is a top plan view showing a diagram of airflow through the enclosure of the FIG. 1.

V. Airflow Cooling and the Metering Plate:

FIG. 8 shows a top view of the airflow cooling design of the illustrated modular electronic enclosure 100. Air entering through the air inlet ports 138 of fan units 120, 120a is indicated by arrows 800, 800a, with airflow through the majority the fan compartments toward fans 610, 610a is indicated by arrows 802, 802a, respectively. Air entering through the inlet ports 132 of power units 118, 118a is indicated by arrows 804, 804a, which then traverses through windows 328 of dividers 322 and 326 into fan units 610, 610a. Pressurized air leaving fan units 610, 610a is indicated by arrows 808, 808a which passes through the airflow channels 348 of midplane 300 and across the air metering plate 350 (FIG. 3). The air metering plate 350 ramps upward toward the rear of the chassis, which results in pressurizing the air further, by constricting the airflow passageway. Arrows 810, 810a show the airflow pattern across the metering plate 350 (omitted for clarity from the view of FIG. 8) in the chassis rear portion 304.

The metering plate 350 is replaceable to allow for system upgrades which may impose larger heat loads on the enclosure 100. For example, by increasing the size of metering plate 350, the airflow streams 810, 810a are further pressurized and air velocity is increased to move the heat away faster. In other embodiments, the ramp angle of the metering plate 350 may be varied, raising the ramp to increase velocity, and lowering the ramp to decrease air velocity. In other embodiments, the configuration of the trailing edge of ramp 350 may be varied, such as by adding scallops or cut-out areas to increase airflow across some of the CRU's 700–712 and decrease airflow across others.

Figure 9:
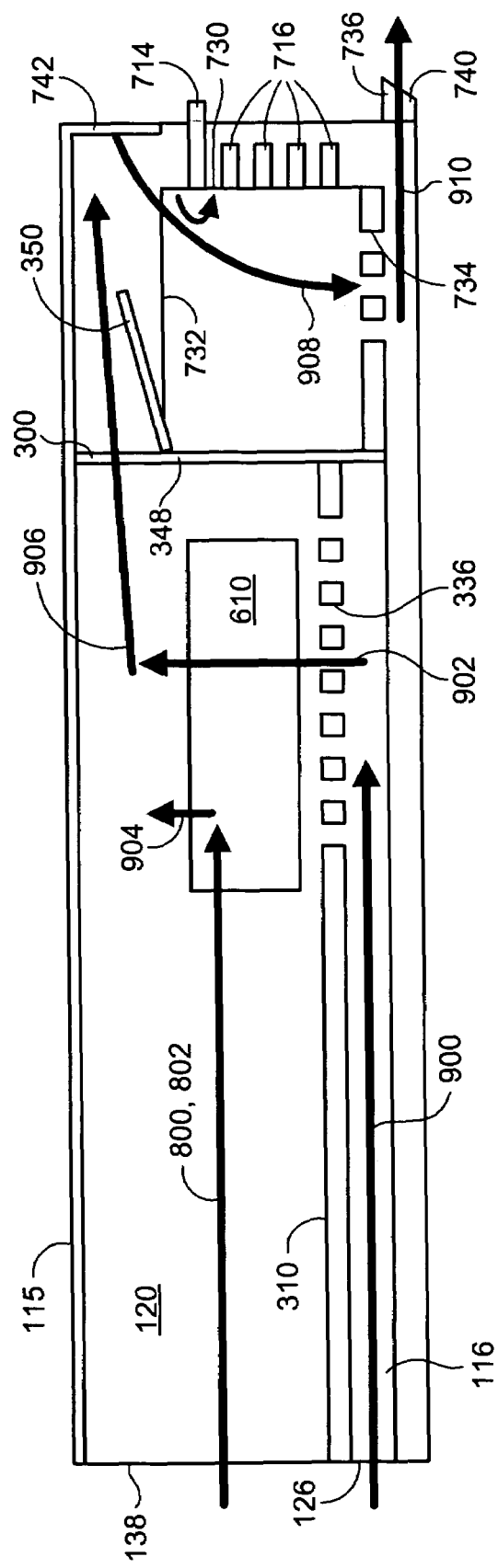
FIG. 9 is a side elevational view showing a diagram of airflow through the enclosure of the FIG. 1.

FIG. 9 shows the airflow passageways through the fan unit 120 and motherboard 116, as arrows 800, 802 and 900, respectively. Warm air from the motherboard 116 passes upward through vent holes 336 in the deck 310, and then into fan 610. Arrow 904 shows pressurized air leaving fan 610, which is then directed through channel 348, as shown by arrow 906, then over the metering plate 350 and into the chassis rear portion 304. The chassis rear wall 742 deflects the airflow downwardly through vents 732 and into the interior of CRU's 700–712. The warmed air may vent outwardly through the faceplates vents 730, or downwardly through vents 734 in the floor 736, to exit through the lower airflow passageway 740.

This airflow design places the fans in the middle of the electronic enclosure to pull in cool air through the front CRU modules 316–320a and push pressurized air through the rear CRU modules 700–712, after which the warm air is vented to atmosphere. This unique airflow design facilitates the high-density packing of CRU's within chassis 115, which is believed today the highest density available for fiber input/output interconnects 716, here capable of carrying a large number of cables, while still maintaining a modular, hot swappable design for the CRU's. In the illustrated embodiment, the overall design is 5.25 inches tall, which is equivalent to three units (3U) high for electronic designers, while still fitting into the 19 inch wide EIA standard rack 102. As mentioned above, the airflow flow concepts described herein may be easily adapted to other arrangements and configurations of CRU's, while still maintaining the hot swapping capability of the CRU's.

VI. Conclusion:

Thus, a modular electronic enclosure 100 having a unique cooling design and useful in practicing a unique cooling method for controlling heat generated by various CRU's house therein. Every CRU may be removed or serviced without disrupting the airflow through the enclosure, including the fan modules 120 or 120a, in part because of the spring-loaded air dams 340–346 (shown open in solid lines, and closed in dashed lines in FIG. 8). The air dams 340–346 restrict airflow into the enclosure when a fan unit 120, 120a or a power unit 118, 118a is removed from chassis 115. Additionally, this unique cooling design allows for a much higher density arrangement of the input/output CRU's 700–712 than currently available in other enclosures.

The modular hot swappable nature of the CRU's, allowing interchange without the need to power down the enclosure, also provides for replaceability from the front and rear of the enclosure, without requiring removal from the mounting racks 102 and without requiring removal of a top cover from the chassis. In this manner, the CRU's are quickly replaced, with interconnect alignment being facilitated by the compartment dividers 310, 322–326 and 726. Bezel latch mechanism 110 allows for a quick hinged opening of the bezel 104, while also allowing the bezel 104 to be quickly removed and quickly replaced when desired. The tactile feedback provided by the spring latch 220 assists a person in determining when the post slots 212, 214 are fully engaged on the hinge posts 202, 204 when replacing the bezel.

The foregoing has described the principles, embodiments and modes of operation of the present invention. However, the invention should not be construed as being limited to the particular embodiments discussed. The above-described embodiments should be regarded as illustrative rather than restrictive, and it should be appreciated that variations may be made in those embodiments by workers skilled in the art without departing from the scope of the present invention as defined by the following claims.

What is claimed is:

1. An enclosure, comprising:
a chassis comprising a first portion defining a first compartment, and a second portion defining a second compartment;
first and second replaceable units replaceably received within said first and second compartments, respectively;
a fan unit replaceably received within a compartment defined by said first portion or said second portion and configured to pull in cooling air through said first portion and exhaust pressurized cooling air through said second portion; and
air metering plate supported by the chassis to direct flow of said pressurized air exhausted from the fan unit through the second replaceable unit.

2. The enclosure of claim 1, wherein:
the chassis defines opposing front and rear faces;
the first compartment is accessible from the front face;
the second compartment is accessible from the rear face; and
the first replaceable unit is slidably received within the first compartment through the front face; and
the second replaceable unit is slidably received within the second compartment through the rear face.

3. The enclosure of claim 1, wherein:
the first portion defines a third compartment located below the first compartment;
the enclosure further comprises a third replaceable unit replaceably received within said third compartment; and
the fan unit pulls in cooling air through the first and third replaceable units and exhausts pressurized cooling air through the second replaceable unit.

4. The enclosure of claim 3, wherein:
the first replaceable unit comprises a power unit;
the second replaceable unit comprises an input/output unit; and
the third replaceable unit comprises a logic board.

5. The enclosure of claim 1, wherein:
the first portion defines a third compartment located beside the first compartment;
the enclosure further comprises a third replaceable unit replaceably received within said third compartment;
the first and third compartments each define an entrance for slidably receiving the respective first and third replaceable units;
the enclosure further comprises one spring biased air dam located at the entrance of the first compartment and another spring biased air dam located at the entrance of the third compartment, with each air dam opening to receive the associated replaceable unit and closing the associated entrance when the associated replaceable unit is removed from the associated compartment.

6. The enclosure of claim 5, wherein:
the first replaceable unit comprises a power unit;
the second replaceable unit comprises an input/output unit; and
the third replaceable unit comprises a second fan unit.

7. The enclosure of claim 1, wherein:
the chassis defines opposing front and rear faces;
the second portion defines plural compartments;
the second compartment and said plural compartments are accessible from the rear face;
the enclosure further comprises plural replaceable units each replaceably and slidably received within an associated one of said plural compartments; and
at least some of the plural replaceable units comprise an input/output unit.

8. The enclosure of claim 1, further comprising a midplane member supported by the chassis to separate the first portion from the second portion, and configured to define an airflow channel between the first and second portions to direct said pressurized air exhausted from the fan unit to the air metering plate.

9. The enclosure of claim 1, wherein:
the chassis defines a front face, with the first compartment being accessible from the front face;
the first replaceable unit is slidably received within the first compartment through the front face; and
the enclosure further comprises a bezel door pivotally attached to the chassis for pivotal closure over said front face and pivotal opening to expose said front face, with the bezel door also being detachably attached to the chassis for removal therefrom and reattachment thereto.

10. The enclosure of claim 9, further comprising a bezel latch mechanism which pivotally and detachably attaches the bezel door to the chassis, with the latch mechanism including a spring latch member having a latch finger, wherein the chassis defines a latch lock engaging member which is engaged by the latch finger when the bezel door is attached to the chassis for pivotal opening and closing.

11. The enclosure of claim 1, wherein:
the first portion defines a third compartment located below the first compartment, fourth, fifth and sixth compartments located above the first compartment, with the sixth compartment slidably and replaceably receiving the fan unit;
the chassis defines opposing front and rear faces;
the first, third, fourth, fifth and sixth compartments are accessible from the front face;
the first replaceable unit is slidably received within the first compartment through the front face;
the modular electronic enclosure further comprises third, fourth and fifth replaceable units which are slidably received within the respective third, fourth and fifth compartments through the front face;
the second replaceable unit is slidably received within the second compartment through the rear face;
the enclosure further comprises four spring biased air dams one located at an entrance of an associated one of the first, fourth, fifth and sixth compartments, with each air dam opening to receive the associated replaceable unit and closing the associated entrance when the associated replaceable unit is removed from the associated compartment;
the fan unit pulls in cooling air through at least the first and third replaceable units and exhausts pressurized cooling air through the second replaceable unit;
the enclosure further comprises a midplane member supported by the chassis to separate the first portion from the second portion, and configured to define an airflow channel between the first and second portions to direct said pressurized air exhausted from the fan unit to the air metering plate; and
the enclosure further comprises a bezel door, and a bezel latch mechanism which pivotally and detachably attaches the bezel door to the chassis for pivotal closure over said front face and pivotal opening to expose said front face, with the bezel door being detachably attached to the chassis for removal therefrom and reattachment thereto, and with the latch mechanism including a spring latch member which engages a latch lock member supported by the chassis when the bezel door is attached to the chassis for pivotal opening and closing.

12. The enclosure of claim 11, wherein:
the first replaceable unit comprises a power unit:
the second replaceable unit comprises an input/output unit;
the third replaceable unit comprises a logic board;
the fourth replaceable unit comprises another power unit; and
the fifth replaceable unit comprises another fan unit.

13. An enclosure, comprising:
means for partitioning a chassis into first and second portions:
means for slidably and replaceably receiving first and second replaceable units within the respective first and second portions;
means for pulling cooling air through the first replaceable unit;
means for pressurizing said cooling air;
means for delivering said pressurized cooling air through the second replaceable unit;
second means for pressurizing the cooling air; and
means for powering said second means for pressurizing when said means for pressurizing is removed from the chassis.

14. The enclosure of claim 13, further comprising:
means for metering airflow through the second replaceable unit; and
wherein said means for partitioning further comprises means for allowing said pressurized cooling air to flow from the first portion to the second portion.

15. The enclosure of claim 13, further comprising means for restricting cooling airflow into said means for slidably receiving the first replaceable unit within the first portion when said first replaceable unit is removed therefrom.

16. The enclosure of claim 15, wherein said means for restricting further comprises means for spring biasing said means for restricting into a closed position when the first replaceable unit is removed.

17. The enclosure of claim 13, further comprising means for covering and accessing said means for slidably receiving the first replaceable unit, wherein said means for covering and accessing comprises means for pivotally opening and closing an access entrance to said first replaceable unit, and means for replaceably removing said means for covering and accessing from the chassis.

18. The enclosure of claim 17, further comprising means for providing tactile feedback when said means for covering and accessing is reattached to the chassis.

19. The enclosure of claim 13, further comprising:
first and second means for powering the first and second replaceable units;
means for slidably and replaceably receiving said first and second means for powering within the first portion; and
wherein the second means for powering continues to power the first and second replaceable units when the first means for powering is removed from the chassis.

20. A method of cooling an enclosure defining first and second compartments, comprising:
slidably and removably installing first and second replaceable units within the respective first and second compartments;
pulling cooling air through the first replaceable unit;
pressurizing said cooling air;
forcing said pressurized cooling air through the second replaceable unit; and
restricting airflow into the first compartment when said first replaceable unit is removed therefrom.

21. The method of claim 20, further comprising metering and directing the flow of said pressurized cooling air upon entering the second compartment.

22. The method of claim 20, wherein said restricting comprises spring biasing an air dam to cover an entrance to said first compartment.

23. The method of claim 22, further comprising opening the air dam covering said entrance with the first replaceable unit during said installing thereof within the first compartment.

24. The method of claim 20, further comprising:
slidably and removably installing a third replaceable unit within a third compartment defined by the enclosure which is located below said first compartment; and
wherein said pulling further comprises pulling cooling air through the third replaceable unit before pressurizing thereof.

25. The method of claim 20, further comprising:
covering and accessing an entrance to the first compartment with a bezel door;
wherein said covering comprises pivoting the bezel door from an open state to a closed state; and
wherein said accessing comprises pivoting the bezel door from the closed state to the open state and removing said bezel door from the enclosure.

26. The method of claim 25, further comprising:
replacing said bezel door on the enclosure for pivoting from the open state to the closed state; and
providing a tactile response during said replacing when the bezel door is a position for said pivoting to the closed state.

* * * * *

UNITED STATES PATENT AND TRADEMARK OFFICE
CERTIFICATE OF CORRECTION

| | | |
|---|---|---|
| PATENT NO. | : 6,980,435 B2 | Page 1 of 1 |
| APPLICATION NO. | : 10/767936 | |
| DATED | : December 27, 2005 | |
| INVENTOR(S) | : Kent N. Shum et al. | |

It is certified that error appears in the above-identified patent and that said Letters Patent is hereby corrected as shown below:

In column 6, line 13, delete "FIG. 31," and insert -- FIG. 3, --, therefor.

In column 11, line 27, in Claim 11, delete "dosing" and insert -- closing --, therefor.

In column 11, line 51, in Claim 12, after "unit" delete ":" and insert -- ; --, therefor.

In column 11, line 61, in Claim 13, after "portions" delete ":" and insert -- ; --, therefor.

Signed and Sealed this

Twenty-first Day of July, 2009

JOHN DOLL
*Acting Director of the United States Patent and Trademark Office*